United States Patent
Toya et al.

(10) Patent No.: US 12,180,368 B2
(45) Date of Patent: Dec. 31, 2024

(54) THERMAL-CONDUCTIVE SILICONE COMPOSITION, PRODUCTION METHOD THEREFOR, AND SEMICONDUCTOR DEVICE

(71) Applicant: SHIN-ETSU CHEMICAL CO., LTD., Tokyo (JP)

(72) Inventors: Wataru Toya, Annaka (JP); Keita Kitazawa, Annaka (JP); Takahiro Yamaguchi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 776 days.

(21) Appl. No.: 17/440,641

(22) PCT Filed: Feb. 10, 2020

(86) PCT No.: PCT/JP2020/005048
§ 371 (c)(1),
(2) Date: Sep. 17, 2021

(87) PCT Pub. No.: WO2020/202800
PCT Pub. Date: Oct. 8, 2020

(65) Prior Publication Data
US 2022/0162447 A1    May 26, 2022

(30) Foreign Application Priority Data
Apr. 1, 2019    (JP) .................. 2019-069871

(51) Int. Cl.
C08L 83/04    (2006.01)
C08K 3/28    (2006.01)
H01L 23/373    (2006.01)

(52) U.S. Cl.
CPC ................ *C08L 83/04* (2013.01); *C08K 3/28* (2013.01); *H01L 23/3737* (2013.01);
(Continued)

(58) Field of Classification Search
CPC .......... C08L 83/04; C08L 83/06; C08K 3/28; C08K 2003/282; C08K 2201/001;
(Continued)

(56) References Cited

U.S. PATENT DOCUMENTS 6,174,841 B1    1/2001  Yamada et al.
2003/0049466 A1    3/2003  Yamada et al.
(Continued)

FOREIGN PATENT DOCUMENTS

EP    0 993 041 A2    4/2000
JP    2938428 B1    8/1999
(Continued)

OTHER PUBLICATIONS

Oct. 23, 2023 Office Action and Search Report issued in Taiwanese Patent Application No. 109105821.
(Continued)

*Primary Examiner* — Andrew J. Oyer
(74) *Attorney, Agent, or Firm* — Oliff PLC

(57) ABSTRACT

A thermal-conductive silicone composition containing: (A) a hydrolysable organopolysiloxane having an alkoxysilyl group; and (B) aluminum nitride particles having an average particle size of 0.5 μm or more and 2.0 μm or less and contained in an amount of 50 to 70 volume %. A content of coarse particles in the aluminum nitride particles is 1.0 volume % or less relative to the entire aluminum nitride particles, the coarse particles having particle sizes of 10 μm or more according to a particle size distribution measurement method by laser diffraction. The thermal-conductive silicone composition has a heat conductivity of 1.3 W/mK or more according to a hot disc method. The present invention provides: a thermal-conductive silicone composition having
(Continued)

high heat conductivity and being compressible to 10 μm or less; and a production method of the thermal-conductive silicone composition.

18 Claims, 1 Drawing Sheet

(52) U.S. Cl.
CPC .. *C08K 2003/282* (2013.01); *C08K 2201/001* (2013.01); *C08K 2201/005* (2013.01)

(58) Field of Classification Search
CPC .......... C08K 2201/005; H01L 23/3737; H01L 23/3731; H01L 23/42; H01L 23/373; C08J 3/20; C08J 3/203; C08G 77/04; C08G 77/16; C09K 5/14
See application file for complete search history.

(56) References Cited

U.S. PATENT DOCUMENTS

| | | | |
|---|---|---|---|
| 2007/0149834 A1* | 6/2007 | Endo | C08L 83/04 585/7 |
| 2008/0254247 A1 | 10/2008 | Asaine | |
| 2011/0024675 A1 | 2/2011 | Endo et al. | |
| 2012/0119137 A1 | 5/2012 | Tsuji et al. | |
| 2018/0134938 A1* | 5/2018 | Hirakawa | C08L 83/04 |
| 2019/0292349 A1 | 9/2019 | Ito | |
| 2020/0181334 A1* | 6/2020 | Ishihara | C07F 7/1804 |

FOREIGN PATENT DOCUMENTS

| | | |
|---|---|---|
| JP | 2938429 B1 | 8/1999 |
| JP | 2000-109373 A | 4/2000 |
| JP | 2004-091743 A | 3/2004 |
| JP | 3580366 B2 | 10/2004 |
| JP | 3952184 B2 | 8/2007 |
| JP | 2008-260798 A | 10/2008 |
| JP | 2009-209165 A | 9/2009 |
| JP | 4572243 B2 | 11/2010 |
| JP | 4656340 B2 | 3/2011 |
| JP | 2012-069783 A | 4/2012 |
| JP | 4913874 B2 | 4/2012 |
| JP | 4917380 B2 | 4/2012 |
| JP | 2012-096361 A | 5/2012 |
| JP | 2012-102283 A | 5/2012 |
| JP | 4933094 B2 | 5/2012 |
| JP | 2017-031231 A | 2/2017 |
| JP | 2017-210518 A | 11/2017 |
| JP | 2017-226724 A | 12/2017 |
| WO | 2019/031082 A1 | 2/2019 |

OTHER PUBLICATIONS

Jan. 24, 2024 Office Action issued in European Patent Application No. 20 782 534.0.
Tokuyama; "Aluminum nitride (AlN) filler"; Jul. 17, 2019; https://www.tokuyama.co.jp/eng/products/advanced_materials/aln_filler.html; pp. 1-5.
Apr. 28, 2020 International Search Report issued in International Patent Application No. PCT/JP2020/005048.
Mar. 3, 2023 Search Report issued in European Patent Application No. 20782534.0.

* cited by examiner

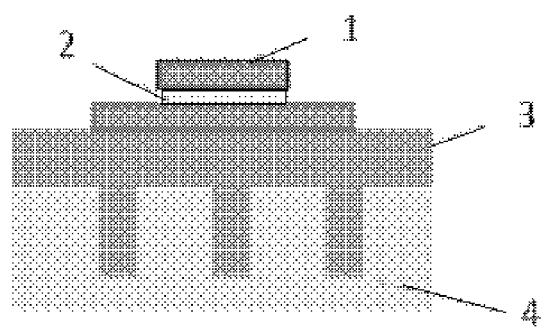

THERMAL-CONDUCTIVE SILICONE COMPOSITION, PRODUCTION METHOD THEREFOR, AND SEMICONDUCTOR DEVICE

TECHNICAL FIELD

The present invention relates to a thermal-conductive silicone composition. Specifically, the present invention relates to a thermal-conductive silicone composition that enables efficient cooling of electronic parts, a production method for the thermal-conductive silicone composition, and a semiconductor device.

BACKGROUND ART

It is widely known that electronic parts generate heat in use, thereby lowering the performances thereof. As means for solving this problem, various heat dissipating techniques have been used. Typically, a cooling member (such as heat sink) is disposed near a heat-generating part such that the two are brought into close contact with each other to efficiently remove and dissipate heat from the cooling member. In this event, if there is a space between the heat-generating member and the cooling member, air, which is poor heat conductor, is interposed therebetween and increases the thermal resistance, so that the temperature of the heat-generating member cannot be reduced sufficiently. To prevent such phenomenon, heat-dissipating materials having good heat conductivity and followability to the surface of the member have been used, such as liquid heat-dissipating materials and heat-dissipating sheets. Particularly, depending on devices, there is a case where such a gap is 10 μm or less and this gap is quite narrow. In such cases, a liquid heat-dissipating material compressible to 10 μm or less is employed (Patent Documents 1 to 13).

Moreover, electrically insulating state is often required between a heat-generating part and a cooling member, so that heat-conductive materials may be demanded to have insulating property. In these cases, metal particles of aluminum, copper, silver, or the like cannot be used as a heat-conductive filling material; instead, heat-conductive, electrically insulating filling materials, such as aluminum hydroxide and alumina (aluminum oxide), are frequently used. Aluminum hydroxide and alumina have low heat conductivity in themselves. Therefore, when these are used to obtain heat-conductive materials having high thermal conductivity, the filling amounts have to be large. This results in problems, for example, that the heat-conductive materials have considerably high viscosity, are difficult to apply, and cannot be compressed sufficiently (Patent Documents 14, 15).

Further, since heat generation and cooling by a heat-generating part and a cooling member are repeated, it is known that the members are thermally contracted repeatedly. This promotes the separation between oil component and heat-conductive filler in the thermal-conductive silicone composition. Moreover, pump-out phenomenon occurs in which a thermal-conductive silicone composition is pushed out from between a heat-generating part and a cooling member. Consequently, the thermal resistance is increased, and the heat-generating part cannot be cooled efficiently. To prevent such a phenomenon, adding a thickener has been proposed as an approach to increase the viscosity of a thermal-conductive silicone composition. However, this has a problem that the viscosity becomes too high and makes the coating difficult (Patent Document 16).

CITATION LIST

Patent Literature

Patent Document 1: JP 2938428 B
Patent Document 2: JP 2938429 B
Patent Document 3: JP 3580366 B
Patent Document 4: JP 3952184 B
Patent Document 5: JP 4572243 B
Patent Document 6: JP 4656340 B
Patent Document 7: JP 4913874 B
Patent Document 8: JP 4917380 B
Patent Document 9: JP 4933094 B
Patent Document 10: JP 2008-260798 A
Patent Document 11: JP 2009-209165 A
Patent Document 12: JP 2012-102283 A
Patent Document 13: JP 2012-96361 A
Patent Document 14: JP 2017-226724 A
Patent Document 15: JP 2017-210518 A
Patent Document 16: JP 2004-91743 A

SUMMARY OF INVENTION

Technical Problem

As described above, it has been demanded to develop a thermal-conductive silicone composition having both high heat conductivity and compressibility to 10 μm or less. The present invention has been made in view of the above circumstances. An object of the present invention is to provide a thermal-conductive silicone composition having higher heat conductivity than conventional thermal-conductive silicone compositions and being compressible to 10 μm or less, and a production method thereof.

Solution to Problem

To achieve the object, the present invention provides a thermal-conductive silicone composition comprising the following components (A) and (B):

(A) a hydrolysable organopolysiloxane having an alkoxysilyl group; and
(B) aluminum nitride particles having an average particle size of 0.5 μm or more and 2.0 μm or less and contained in an amount of 50 to 70 volume %, wherein
a content of coarse particles in the aluminum nitride particles is 1.0 volume % or less relative to the entire aluminum nitride particles, the coarse particles having particle sizes of 10 μm or more according to a particle size distribution measurement method by laser diffraction, and
the thermal-conductive silicone composition has a heat conductivity of 1.3 W/mK or more according to a hot disc method.

This thermal-conductive silicone composition has higher heat conductivity than conventional thermal-conductive silicone compositions, and also has favorable compressibility to 10 μm or less.

Preferably, the aluminum nitride particles have an oxygen content of 1.0 mass % or less.

With the oxygen content being such a predetermined value or less, the thermal-conductive silicone composition has higher heat conductivity.

Preferably, the thermal-conductive silicone composition has a thermal resistance of 5.0 mm²·K/W or less as measured at 25° C. by a laser flash method.

With the thermal resistance being such a predetermined value or less, the thermal-conductive silicone composition has higher heat conductivity.

Preferably, the thermal-conductive silicone composition has an absolute viscosity of 3 to 500 Pa·S as measured with a spiral viscometer at 25° C. and a shear rate of 6 S⁻¹.

With the absolute viscosity being in this predetermined range, it is easy to eject the thermal-conductive silicone composition and keep the shape thereof, so that the workability is favorable.

Moreover, the present invention provides a semiconductor device comprising the above-described thermal-conductive silicone composition interposed in a space formed between a heat generator and a cooler, the space having a thickness of 10 μm or less.

This semiconductor device has high cooling performance because the thermal-conductive silicone composition having higher heat conductivity than conventional thermal-conductive silicone compositions and favorable compressibility of 10 μm or less is interposed in a narrow space formed between a heat generator and a cooler.

The heat generator is preferably an insulated-gate bipolar transistor (IGBT).

When the heat generator is an IGBT, the IGBT is efficiently cooled in this semiconductor device.

Further, the present invention provides a production method for producing the thermal-conductive silicone composition, the method comprising a step of mixing the components (A) and (B) at a temperature of 100° C. or more for 30 minutes or more.

According to this production method, the thermal-conductive silicone composition having higher heat conductivity than conventional thermal-conductive silicone compositions and favorable compressibility to 10 μm or less can be produced.

Advantageous Effects of Invention

The present invention makes it possible to obtain a thermal-conductive silicone composition having high heat conductivity in comparison with conventional thermal-conductive silicone compositions and having favorable compressibility to 10 μm or less.

BRIEF DESCRIPTION OF DRAWINGS

FIG. 1 is a cross-sectional view showing an example of a semiconductor device in which a thermal-conductive silicone composition according to the present invention is interposed in a space between an insulated-gate bipolar transistor and a cooling fin.

DESCRIPTION OF EMBODIMENTS

As described above, there have been demands for the development of a silicone composition having high heat conductivity and favorable compressibility to 10 μm or less.

The present inventors have earnestly studied the above-described problems and consequently found that when a hydrolysable organopolysiloxane having an alkoxysilyl group is incorporated with aluminum nitride having an average particle size within a specific range and fewer coarse particles, the resulting silicone composition has higher heat conductivity than conventional silicone compositions and also has favorable compressibility to 10 μm or less. This finding has led to the completion of the present invention.

Specifically, the present invention is a thermal-conductive silicone composition comprising the following components (A) and (B):

(A) a hydrolysable organopolysiloxane having an alkoxysilyl group; and (B) aluminum nitride particles having an average particle size of 0.5 μm or more and 2.0 μm or less and contained in an amount of 50 to 70 volume %, wherein a content of coarse particles in the aluminum nitride particles is 1.0 volume % or less relative to the entire aluminum nitride particles, the coarse particles having particle sizes of 10 μm or more according to a particle size distribution measurement method by laser diffraction, and the thermal-conductive silicone composition has a heat conductivity of 1.3 W/mK or more according to a hot disc method.

Hereinbelow, the present invention will be described in detail.

[(A) Component]

The component (A) is a hydrolysable organopolysiloxane having an alkoxysilyl group. The component (A) acts as a surface treatment agent for a heat-conductive filling material as the component (B), which will be described later. Thus, strong interaction takes place between the component (A) and the heat-conductive filler which is the component (B). This consequently allows the thermal-conductive silicone composition to keep the flowability even when the thermal-conductive silicone composition is filled with a large amount of the heat-conductive filler which is the component (B). Simultaneously, it is also possible to suppress decreases in the heat-dissipating performance, which would otherwise occur due to oil separation and pumping out over time. Examples of the component (A) include organopolysiloxanes shown by the following general formula (1). Particularly, it is preferable to incorporate a trifunctional hydrolysable organopolysiloxane.

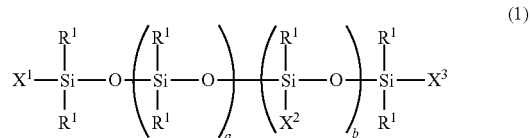

In the formula, each $R^1$ independently represents an unsubstituted or substituted monovalent hydrocarbon group. $X^1$, $X^2$, and $X^3$ each represent a group represented by $R^1$ or $-(R^2)_n-SiR^3_g(OR^4)_{3-g}$, and may differ from one another, but at least one of $X^1$, $X^2$, and $X^3$ is $-(R^2)_n-SiR^3_g(OR^4)_{3-g}$. $R^2$ represents an oxygen atom or an alkylene group having 1 to 4 carbon atoms. Each $R^3$ independently represents an unsubstituted or substituted monovalent hydrocarbon group containing no aliphatic unsaturated bond. Each $R^4$ independently represents an alkyl group having 1 to 4 carbon atoms, an alkoxyalkyl group, an alkenyl group, or an acyl group. "n" represents 0 or 1. "g" represents an integer of 0 to 2. "a" and "b" respectively satisfy $1 \leq a \leq 1{,}000$ and $0 \leq b \leq 1{,}000$.

In the formula (1), each $R^1$ is independently an unsubstituted or substituted monovalent hydrocarbon group having preferably 1 to 10, more preferably 1 to 6, further preferably 1 to 3 carbon atoms. Examples thereof include linear alkyl groups, branched alkyl groups, cyclic alkyl groups, alkenyl groups, aryl groups, aralkyl groups, halogenated alkyl groups, etc. Examples of the linear alkyl groups include a methyl group, ethyl group, propyl group, hexyl group, and octyl group. Examples of the branched alkyl groups include an isopropyl group, isobutyl group, tert-butyl group, and 2-ethylhexyl group. Examples of the cyclic alkyl groups include a cyclopentyl group and cyclohexyl group. Examples of the alkenyl groups include a vinyl group and allyl group. Examples of the aryl groups include a phenyl group and tolyl group. Examples of the aralkyl groups include a 2-phenylethyl group and 2-methyl-2-phenylethyl group. Examples of the halogenated alkyl groups include a 3,3,3-trifluoropropyl group, 2-(nonafluorobutyl)ethyl group, and 2-(heptadecafluorooctyl)ethyl group. $R^1$ is preferably a methyl group, phenyl group, or vinyl group.

Examples of the alkylene group having 1 to 4 carbon atoms as $R^2$ include a methylene group, ethylene group, propylene group, butylene group, etc. Each $R^3$ is independently an unsubstituted or substituted monovalent hydrocarbon group containing no aliphatic unsaturated bond but having preferably 1 to 10, more preferably 1 to 6, further preferably 1 to 3 carbon atoms. Examples thereof include: alkyl groups, such as a methyl group, ethyl group, propyl group, isopropyl group, butyl group, an isobutyl group, tert-butyl group, pentyl group, neopentyl group, hexyl group, heptyl group, octyl group, nonyl group, decyl group, and dodecyl group; cycloalkyl groups, such as a cyclopentyl group, cyclohexyl group, and cycloheptyl group; aryl groups, such as a phenyl group, tolyl group, xylyl group, naphthyl group, and biphenylyl group; aralkyl groups, such as a benzyl group, phenylethyl group, phenylpropyl group, and methylbenzyl group; groups obtained from these groups by substituting a part or all of hydrogen atoms bonded to a carbon atom(s) therein with a cyano group, a halogen atom, such as fluorine, chlorine, and bromine, or the like; etc.

Each $R^4$ is independently an alkyl group having 1 to 4 carbon atoms, an alkoxyalkyl group, an alkenyl group, or an acyl group. Examples of the alkyl group as $R^4$ include the same alkyl groups having 1 to 4 carbon atoms exemplified as $R^1$; etc. Examples of the alkoxyalkyl group include a methoxyethyl group, methoxypropyl group, etc. The acyl group as $R^4$ is preferably, for example, ones having 2 to 8 carbon atoms, and examples thereof include an acetyl group, octanoyl group, etc. $R^4$ is preferably the alkyl group, particularly preferably a methyl group or ethyl group.

"a" and "b" are as defined above. a+b is preferably 10 to 1000, more preferably 10 to 300. "n" is 0 or 1. "g" is an integer of 0 to 2, preferably 0. Note that the number of $OR^4$ groups per molecule is preferably 1 to 6, particularly preferably 3 or 6. Additionally, the order of bonding the siloxane units shown in the parentheses is not limited to the following description.

Preferable specific examples of the component (A) can include the following.

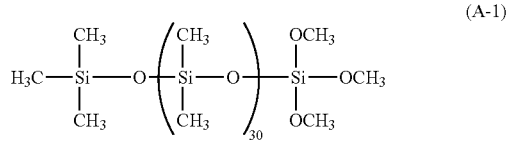

(A-1)

The component (A) is a main component of the thermal-conductive silicone composition, and is blended in an amount of preferably 30 to 50 volume %, further preferably 40 to 50 volume %, in the thermal-conductive silicone composition. Incorporating the component (A) in this range makes it possible to prevent the thermal resistance from lowering, which would otherwise occur due to oil separation and/or pumping out, while keeping the favorable compressibility. Additionally, one kind of the component (A) may be blended singly, or two or more kinds thereof may be blended in combination.

[(B) Component]

The inventive thermal-conductive silicone composition contains (B) aluminum nitride particles as a heat-conductive filling material. Aluminum nitride has higher heat conductivity than alumina. Thus, even when the amount is small, the thermal-conductive silicone composition having high heat conductivity is successfully obtained in comparison with a case where aluminum oxide is employed. The aluminum nitride particles as the component (B) have an average particle size of 0.5 μm or more and 2.0 μm or less, preferably 0.5 μm or more and 1.5 μm or less. If the aluminum nitride particles (B) have an average particle size exceeding 2.0 μm, the compressibility of the resulting thermal-conductive silicone composition is significantly lowered. Meanwhile, if the aluminum nitride particles (B) have an average particle size of less than 0.5 μm, the viscosity of the thermal-conductive silicone composition is significantly increased.

The average particle size refers to a volume average particle size (cumulative average diameter $D_{50}$ (median size)) determined according to Microtrac (laser diffraction scattering method), and can be measured, for example, with Microtrac MT3300EX manufactured by Nikkiso Co., Ltd.

In the aluminum nitride particles of the component (B), a content of coarse particles having particle sizes of 10 μm or more is 1.0 volume % or less. If the content of the coarse particles exceeds 1.0 volume %, the compressed thermal-conductive silicone composition cannot have a thickness of 10 μm or less. Although the lower limit is not particularly limited, the content of the coarse particles may be, for example, 0.001 volume % or more in view of the technical detection limit. The smaller the coarse particles in the aluminum nitride particles, the more preferable. The coarse particles preferably have particle sizes of 12 μm or less.

The content of the coarse particles can be measured, for example, with Microtrac MT3300EX manufactured by Nikkiso Co., Ltd.

The inventive thermal-conductive silicone composition contains the aluminum nitride particles (B) in an amount of 50 to 70 volume %. If the content of the aluminum nitride particles (B) is less than 50 volume %, the heat conductivity of the thermal-conductive silicone composition is decreased. If the content exceeds 70 volume %, the thermal-conductive silicone composition cannot be uniform.

The aluminum nitride particles which is the component (B) have an oxygen content of preferably 1.0 mass % or less, more preferably 0.5 mass % or less. The use of the aluminum nitride particles as the component (B) whose oxygen content is 1.0 mass % or less can enhance the heat conductivity of the thermal-conductive silicone composition. The lower limit of the oxygen content is not particularly limited, and can be 0.13 mass %, for example. Note that the oxygen content can be measured with ENGA-120 manufactured by HORIBA, Ltd.

The method for producing the aluminum nitride particles which is the component (B) may follow either direct nitridation method or reductive nitridation method, preferably reductive nitridation method. This is because the direct nitridation method involves a crushing step, so that the aluminum nitride particles have irregular shapes; meanwhile, aluminum nitride particles produced by the reductive nitridation method are generally rounded and have favorable filling property.

[Other Components]

The inventive thermal-conductive silicone composition may be blended with an organo(poly)siloxane, such as methylpolysiloxane, to adjust the elasticity or viscosity of the composition. Moreover, to prevent deterioration of the thermal-conductive silicone composition, a conventionally-known antioxidant, such as 2,6-di-t-butyl-4-methylphenol, may be blended as necessary. Further, a thixotropic agent, a dye, a pigment, a flame retardant, a precipitation-inhibitor, a thixotropy-enhancer, or other additives can be blended as necessary.

[Silicone Composition]

The inventive thermal-conductive silicone composition has a heat conductivity of 1.3 W/mK or more according to a hot disc method. Note that the details of the method for measuring the heat conductivity can be exemplified by the method in Examples to be described later. The upper limit of the heat conductivity is not particularly limited, and the upper limit may be, for example, 10 W/mK according to the hot disc method.

The inventive thermal-conductive silicone composition has favorable compressibility. When pressurized at 4.1 MPa for 2 minutes, the thermal-conductive silicone composition has a thickness within a range of preferably 0.5 to 10 μm, more preferably 0.5 to 5 μm. Note that the method for measuring the thickness after the pressurization can be exemplified by the method in Examples to be described later.

The inventive thermal-conductive silicone composition has both high heat conductivity and favorable compressibility, and thus has low thermal resistance. The thermal-conductive silicone composition has a thermal resistance of preferably 5.0 mm$^2$·K/W or less, further preferably 3.0 mm$^2$·K/W or less, as measured at 25° C. by a laser flash method. The lower limit is not particularly limited, and can be for example 0.1 mm$^2$·K/W in consideration of the physical aspect. Note that the details of the method for measuring the thermal resistance can be exemplified by the method in Examples to be described later.

The inventive thermal-conductive silicone composition has an absolute viscosity of preferably 3 to 500 Pa·s, more preferably 10 to 500 Pa·s, as measured at 25° C. With the absolute viscosity being 3 Pa·s or more, the shape is easily maintained, and the workability is improved. Meanwhile, with the absolute viscosity of 500 Pa·s or less, the ejection is easy, so that the workability is improved. The absolute viscosity can be adjusted through the formulation of the aforementioned components. In the present invention, the absolute viscosity refers to a value measured with a spiral viscometer, for example, manufactured by Malcom Co., Ltd., at 25° C. and a shear rate of 6 S$^{-1}$.

[Semiconductor Device]

A semiconductor device according to the present invention includes the inventive thermal-conductive silicone composition, which is interposed in a space formed between a heat generator, such as an IGBT, and a cooler, the space having a thickness of 10 μm or less. The inventive thermal-conductive silicone composition is compressed to a thickness of 10 μm or less. Thus, enhancement of cooling efficiency can be expected in comparison with conventional thermal-conductive silicone compositions. The lower limit of the space formed between the heat generator and the cooler is not particularly limited, and can be 0.2 μm, for example. FIG. 1 shows a typical structure, but the present invention is not limited thereto. In the semiconductor device shown in FIG. 1, a thermal-conductive silicone composition 2 is interposed in a space between an IGBT 1 as the heat generator and a cooling fin 3 as the cooler. Heat generated by the IGBT 1 is conducted through the thermal-conductive silicone composition 2 to the cooling fin 3, and dissipated to cooling water 4 in contact with the cooling fin 3.

The method for manufacturing the inventive semiconductor device is not particularly limited. To make the thermal-conductive silicone composition have a thickness of 10 μm or less, the inventive semiconductor device is assembled preferably at a pressure of 0.1 Mpa or more, further preferably at a pressure of 4.0 Mpa or more. The time for the compression can be shortened by increasing the pressure in pressurizing the thermal-conductive silicone composition.

[Production Method for Thermal-Conductive Silicone Composition]

A production method for the inventive thermal-conductive silicone composition will be described, but is not limited to the following.

The method for producing the inventive thermal-conductive silicone composition may follow production methods for conventional thermal-conductive silicone compositions, and is not particularly limited. For example, the method may include a step of mixing the components (A) and (B). Specifically, the inventive thermal-conductive silicone composition can be obtained by mixing the components (A) and (B) and other optional component(s). The mixing apparatus is not particularly limited. It is possible to use a mixer, such as Trimix, Twinmix, or Planetary Mixer (all registered trademarks for mixers manufactured by Inoue Manufacturing Co., Ltd.), Ultramixer (a registered trademark for a mixer manufactured by Mizuho Industrial Co., Ltd.), and Hivis Disper Mix (a registered trademark for a mixer manufactured by PRIMIX Corporation). Additionally, to crush aggregation of the aluminum nitride particles (B) as the heat-conductive filler, a three-roll finishing process or the like may be performed.

In the step of mixing the components (A) and (B), the component (B) can be sufficiently surface-treated with the component (A) by carrying out the mixing at a temperature of 100° C. or more for 30 minutes or more, so that over-time deterioration in the thermal resistance can be suppressed. The upper limit of the temperature in the mixing step is not particularly limited, but is preferably 200° C. or less. Moreover, the upper limit of the duration of the mixing step is not particularly limited, and can be 4 hours, for example.

EXAMPLE

Hereinafter, the present invention will be specifically described by showing Examples and Comparative Examples, but the present invention is not limited to the following Examples.

Components used are as follows.

[Component (A)]

(A-1) a dimethylpolysiloxane containing a trimethoxysilyl group at one terminal, and shown by the following formula

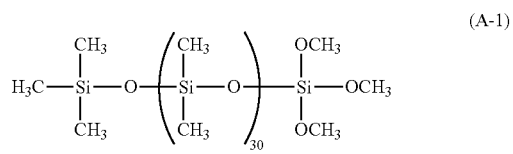

(A-1)

(A-2) a dimethylpolysiloxane having no hydrolysable functional group, and shown by the following formula (comparative material)

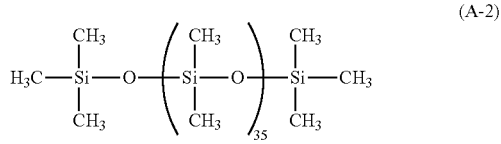

[Component (B)]
(B-1) aluminum nitride particles having an average particle size of 1.0 μm and containing 0.1 volume % or less of coarse particles 10 μm or more in size
(B-2) aluminum nitride having an average particle size of 1.4 μm and containing 0.4 volume % or less of coarse particles 10 μm or more in size
(B-3) aluminum nitride having an average particle size of 0.7 μm and containing 0.1 volume % or less of coarse particles 10 μm or more in size
(B-4) aluminum nitride having an average particle size of 1.5 μm and containing 5.0 volume % or more of coarse particles 10 μm or more in size (comparative material)

Examples 1 to 5, Comparative Examples 1 to 4

<Preparation of Thermal-Conductive Silicone Compositions>

The components (A) and (B) were blended according to the blended amounts shown in Tables 1 and 2 below by the following method to prepare thermal-conductive silicone compositions.

The components (A) and (B) were introduced into 5-liter Planetary Mixer (manufactured by Inoue Manufacturing Co., Ltd.), and mixed at 170° C. for 1 hour. After cooled to normal temperature, the resultant was uniformly mixing. In this manner, thermal-conductive silicone compositions were prepared.

Each of the thermal-conductive compositions obtained by this method was measured for viscosity, heat conductivity, compressibility, and thermal resistance according to the following methods. Tables 1 and 2 show the results.

[Viscosity]
The absolute viscosity of each thermal-conductive silicone composition was measured using a spiral viscometer manufactured by Malcom Co., Ltd. under conditions of: 25° C. and the number of revolutions of 6 $S^{-1}$.

[Thermal Conductivity]
The thermal-conductive silicone composition was wrapped with a kitchen wrap to prepare a test piece in a drawstring-bag form. The heat conductivity was measured under a condition of 25° C. by using TPA-501 manufactured by Kyoto Electronics Manufacturing Co., Ltd.

[Compressibility]
The produced thermal-conductive silicone composition was sandwiched between silicone wafers each having been cut into a circular shape with a diameter of 1 mm. After the pressurization at 4.1 MPa for 2 minutes with AUTOGRAPH AG-SKNZPLUS manufactured by SHIMADZU CORPORATION, the thickness was measured.

[Thermal Resistance]
Using the test pieces, the measurement was performed at 25° C. based on the laser flesh method with a thermal-resistance measurement apparatus (manufactured by NETZSCH GmbH, xenon flash analyzer; LFA 447 NanoFlash).

[Thermal Resistance after Heat Cycles]
The test pieces were subjected to 1000 cycles of a thermal shock test, where the conditions were switched from −40° C.×30 minutes to 150° C.×30 minutes in one cycle, by using a thermal shock chamber TSE-11A manufactured by ESPEC CORP. Then, the thermal resistance was measured at 25° C.

TABLE 1

| | | Example 1 | Example 2 | Example 3 | Example 4 | Example 5 |
|---|---|---|---|---|---|---|
| Composition (parts by mass) | (A-1) | 200 | 200 | 200 | 200 | 200 |
| | (B-1) | 1000 | 0 | 0 | 0 | 0 |
| | (B-2) | 0 | 660 | 1250 | 1000 | 0 |
| | (B-3) | 0 | 0 | 0 | 0 | 1000 |
| Heat-conductive filling material (volume %) | | 60 | 50 | 67 | 60 | 60 |
| Evaluation results | Absolute viscosity (Pa · s) | 110 | 10 | 480 | 140 | 50 |
| | Heat conductivity (W/mK) | 1.9 | 1.4 | 2.0 | 1.8 | 1.4 |
| | Minimum thickness (μm) | 3.8 | 4.4 | 3.7 | 3.7 | 3.3 |
| | Thermal resistance (mm² · K/W) | 2.0 | 3.2 | 1.9 | 2.4 | 2.7 |
| | Thermal resistance after heat cycle test (mm² · K/W) | 2.3 | 2.8 | 2.0 | 2.5 | 2.9 |

TABLE 2

| | | Comparative Example 1 | Comparative Example 2 | Comparative Example 3 | Comparative Example 4 |
|---|---|---|---|---|---|
| Composition (parts by mass) | (A-1) | 0 | 200 | 200 | 200 |
| | (A-2) | 200 | 0 | 0 | 0 |
| | (B-1) | 1000 | 2000 | 300 | 0 |
| | (B-4) | 0 | 0 | 0 | 1000 |
| Heat-conductive filling material (volume %) | | 60 | 75 | 30 | 60 |
| Evaluation results | Absolute viscosity (Pa · s) | uniform composition was not obtained | uniform composition was not obtained | 3 | 100 |
| | Heat conductivity | | | 0.9 | 2.6 |

TABLE 2-continued

|  | Comparative Example 1 | Comparative Example 2 | Comparative Example 3 | Comparative Example 4 |
|---|---|---|---|---|
| (W/mK) |  |  |  |  |
| Minimum thickness (μm) |  |  | 5.6 | 18.0 |
| Thermal resistance (mm² · K/W) |  |  | 7.3 | 7.0 |
| Thermal resistance after heat cycle test (mm² · K/W) |  |  | 7.2 | 7.4 |

From the results in Tables 1 and 2, the thermal-conductive silicone compositions having both of high heat conductivity and favorable compressibility to 10 μm or less were obtained in Examples 1 to 5 satisfying the requirements of the present invention.

In contrast, a uniform thermal-conductive silicone composition was not obtained in Comparative Example 1 not using the component (A) of the present invention. Moreover, a uniform thermal-conductive silicone composition was not obtained in Comparative Example 2, either, in which the amount of the heat-conductive filler was larger than 70 volume %. Further, the heat conductivity was quite low in Comparative Example 3, in which the content of the heat-conductive filler was less than 50 volume %. The compressibility was significantly low in Comparative Example 4 using, as the heat-conductive filler, the aluminum nitride particles in which the content of the coarse particles 10 μm or more in size was more than 1.0 volume % relative to the entire aluminum nitride particles.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A thermal-conductive silicone composition comprising the following components (A) and (B):
   (A) a hydrolysable organopolysiloxane having an alkoxysilyl group; and
   (B) aluminum nitride particles having an average particle size of 0.5 μm or more and 2.0 μm or less and contained in an amount of 50 to 70 volume %, wherein
   a content of coarse particles in the aluminum nitride particles is 1.0 volume % or less relative to the entire aluminum nitride particles, the coarse particles having particle sizes of 10 μm or more according to a particle size distribution measurement method by laser diffraction, and
   the thermal-conductive silicone composition has a heat conductivity of 1.3 W/mK or more according to a hot disc method.

2. The thermal-conductive silicone composition according to claim 1, wherein the aluminum nitride particles have an oxygen content of 1.0 mass % or less.

3. The thermal-conductive silicone composition according to claim 1, wherein the thermal-conductive silicone composition has a thermal resistance of 5.0 mm2·K/W or less as measured at 25° C. by a laser flash method.

4. The thermal-conductive silicone composition according to claim 2, wherein the thermal-conductive silicone composition has a thermal resistance of 5.0 mm2·K/W or less as measured at 25° C. by a laser flash method.

5. The thermal-conductive silicone composition according to claim 1, wherein the thermal-conductive silicone composition has an absolute viscosity of 3 to 500 Pa·S as measured with a spiral viscometer at 25° C. and a shear rate of 6 S-1.

6. The thermal-conductive silicone composition according to claim 2, wherein the thermal-conductive silicone composition has an absolute viscosity of 3 to 500 Pa·S as measured with a spiral viscometer at 25° C. and a shear rate of 6 S-1.

7. The thermal-conductive silicone composition according to claim 3, wherein the thermal-conductive silicone composition has an absolute viscosity of 3 to 500 Pa·S as measured with a spiral viscometer at 25° C. and a shear rate of 6 S-1.

8. The thermal-conductive silicone composition according to claim 4, wherein the thermal-conductive silicone composition has an absolute viscosity of 3 to 500 Pa·S as measured with a spiral viscometer at 25° C. and a shear rate of 6 S-1.

9. A semiconductor device comprising the thermal-conductive silicone composition according to claim 1 interposed in a space formed between a heat generator and a cooler, the space having a thickness of 10 μm or less.

10. The semiconductor device according to claim 9, wherein the heat generator is an insulated-gate bipolar transistor.

11. A production method for producing the thermal-conductive silicone composition according to claim 1, the method comprising a step of mixing the components (A) and (B) at a temperature of 100° C. or more for 30 minutes or more.

12. A production method for producing the thermal-conductive silicone composition according to claim 2, the method comprising a step of mixing the components (A) and (B) at a temperature of 100° C. or more for 30 minutes or more.

13. A production method for producing the thermal-conductive silicone composition according to claim 3, the method comprising a step of mixing the components (A) and (B) at a temperature of 100° C. or more for 30 minutes or more.

14. A production method for producing the thermal-conductive silicone composition according to claim 4, the method comprising a step of mixing the components (A) and (B) at a temperature of 100° C. or more for 30 minutes or more.

15. A production method for producing the thermal-conductive silicone composition according to claim 5, the method comprising a step of mixing the components (A) and (B) at a temperature of 100° C. or more for 30 minutes or more.

16. A production method for producing the thermal-conductive silicone composition according to claim 6, the method comprising a step of mixing the components (A) and (B) at a temperature of 100° C. or more for 30 minutes or more.

17. A production method for producing the thermal-conductive silicone composition according to claim 7, the method comprising a step of mixing the components (A) and (B) at a temperature of 100° C. or more for 30 minutes or more.

18. A production method for producing the thermal-conductive silicone composition according to claim 8, the method comprising a step of mixing the components (A) and (B) at a temperature of 100° C. or more for 30 minutes or more.

* * * * *